United States Patent [19]

Miyabayashi et al.

[11] Patent Number: 4,916,667
[45] Date of Patent: Apr. 10, 1990

[54] DYNAMIC RANDOM ACCESS MEMORY HAVING FOLDED BIT LINE-SHARED SENSE AMPLIFIERS

[75] Inventors: Masayuki Miyabayashi, Kanagawa; Kaneyoshi Takeshita, Tokyo, both of Japan

[73] Assignee: Sony Corporation, Tokyo, Japan

[21] Appl. No.: 287,447

[22] Filed: Dec. 20, 1988

[30] Foreign Application Priority Data

Dec. 25, 1987 [JP] Japan .................................. 62-328895

[51] Int. Cl.⁴ .............................................. G11C 13/00
[52] U.S. Cl. .................................. 365/207; 365/203; 365/210; 365/189.04; 365/230.01
[58] Field of Search ............................... 365/203–207, 365/210, 189.04, 230.01, 190

[56] References Cited

U.S. PATENT DOCUMENTS

| | | | |
|---|---|---|---|
| 4,366,559 | 12/1982 | Misaizu et al. | 365/208 |
| 4,545,037 | 10/1985 | Nakano et al. | 365/207 |
| 4,546,457 | 10/1985 | Nozaki et al. | 365/207 |
| 4,606,010 | 8/1986 | Saito | 365/210 |
| 4,736,343 | 4/1988 | Hidaka et al. | 365/203 |
| 4,739,500 | 4/1988 | Miyamoto et al. | 365/207 |
| 4,803,663 | 2/1989 | Miyamoto et al. | 365/207 |

*Primary Examiner*—Terrell W. Fears
*Attorney, Agent, or Firm*—Philip M. Shaw, Jr.

[57] ABSTRACT

A folded line DRAM having shared sense amplifiers wherein one of two the memory cell arrays is provided with a pair of switches for dividing the bit line pairs into plural bit line pair groups and the second memory cell array is provided with separate switches connected in series the bit line pairs for the purpose of reducing power consumption caused by charging and discharging of the bit lines during accessing.

4 Claims, 3 Drawing Sheets

DYNAMIC RANDOM ACCESS MEMORY HAVING FOLDED BIT LINE-SHARED SENSE AMPLIFIERS

FIELD OF THE INVENTION

This invention relates to a folded bit line type DRAM having sense amplifiers shared by two memory cell arrays, or so-called shared sense amplifiers.

DESCRIPTION OF THE PRIOR ART

There is so far known a DRAM, or dynamic random access memory, having so-called shared sense amplifiers, wherein the memory cell array controlled by one sense amplifier is divided and switch means provided between the memory cell arrays and the sense amplifiers are switched to reduce the bit line capacity by one half to speed up and/or elevate the sensitivity of the read-out and write operations. This technique is disclosed for example in the Japanese Patent Publication No. 61-46918. (U.S. Pat. No. 4,366,559).

FIG. 7 shows diagrammatically the essential portions of a DRAM having these sense amplifiers. There are provided a first memory cell array 71, a second memory cell array 72 and sense amplifiers 73 shared by these memory cell arrays and associated with bit lines, not shown. An input/output line 74 is provided on the side of the first memory cell array 71 opposite to the sense amplifiers 73. Although not shown, switch means are provided on both sides of the sense amplifiers 73.

Let us consider the read-out operation of the above described DRAM. When reading out data from a memory cell of the second memory cell array 72 remote from the I/O line 74, a word line WL is selected and only said second memory cell array 72 is connected by the above switch means to the sense amplifiers 73 for signal amplification. At this time, the first memory cell array 71 and the sense amplifiers 73 are not connected to each other. By bit line division, the read-out operation can be performed speedily and with high sensitivity. After signal amplification, read-out to the I/O line 74 is achieved via bit lines of the first memory cell array 71.

The technique of using these shared sense amplifiers to take advantage of the bit line division is also described in Nikkei Micro-Device, separate volume No. 1, May 1987, "Full Aspect of 4M DRAM. Which is Being Put to Practical Usage", pages 104 to 106 and 260 to 261.

In the above described DRAM, when data are to be transferred from the I/O line 74, the bit lines of the first memory cell array adjacent to the I/O line 74 are necessarily employed. For this reason, even when it is the memory cell of the second memory cell array 72 that is to be accessed, the bit lines of the first memory cell array 71 between the sense amplifiers 73 and the I/O line 74 are necessarily changed and discharged, thus increasing the power consumption. Also, the bit lines to be charged or discharged extend across the two memory cells 71 and 72, thus causing delay in the circuit operation.

SUMMARY OF THE INVENTION

The present invention provides a DRAM having folded bit line-shared sense amplifiers having two memory cell arrays, shared sense amplifiers, I/O lines connected to the sense amplifiers with the memory cell array in-between, and switch means for controlling the connection and disconnection between the sense amplifiers and the bit lines, wherein the switch means on the I/O line side are caused to operate so as to divide the bit lines into plural bit line groups to reduce the power consumption caused by charging and discharging of the bit lines.

DESCRIPTION OF THE PREFERRED EMBODIMENT

Figure 1:
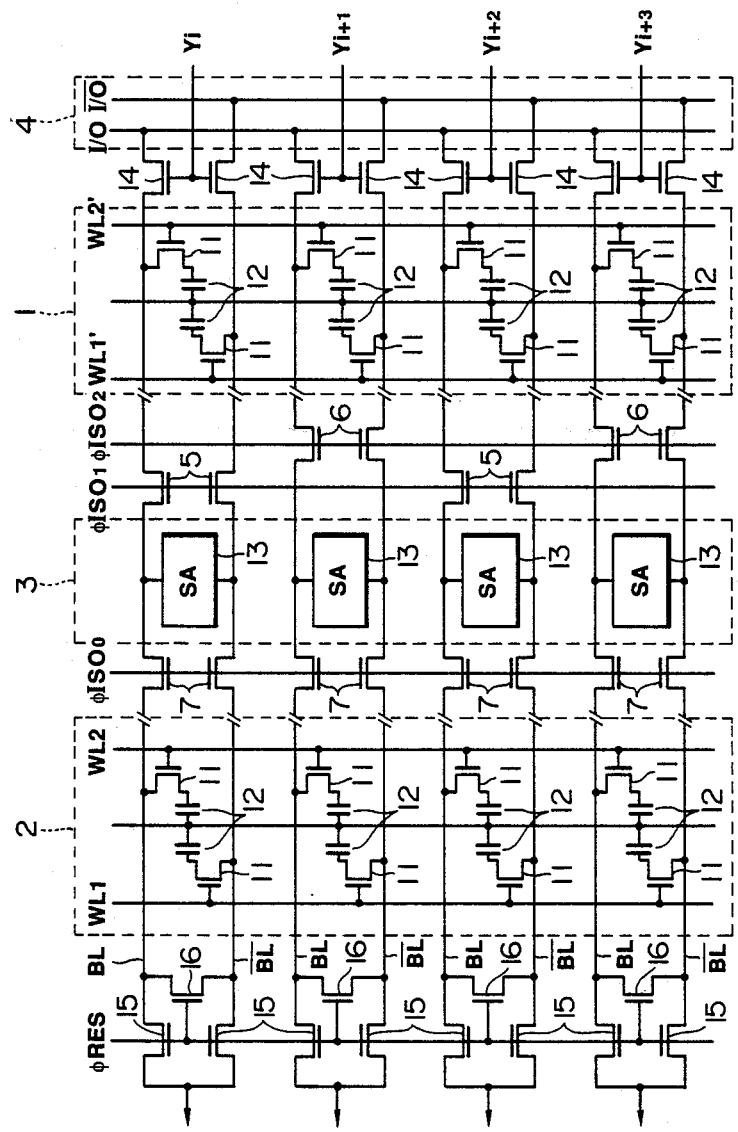
FIG. 1 is a circuit diagram showing essential portions of an embodiment of the DRAM according to the present invention.

By referring to the drawings, certain preferred embodiments of the present invention will be explained.

First Embodiment

The construction of a DRAM of the first embodiment is hereafter explained by referring to FIG. 1.

The DRAM (dynamic RAM) of the present embodiment is formed by a first memory cell array 1 and a second memory cell array 2, each comprised of a matrix of a plurality of memory cells, a sense amplifier array 3 comprised of a plurality of sense amplifiers 13 provided between these two memory cell arrays 1 and 2, and an I/O line pair 4 on the other side of the first memory cell array 1 with respect to the sense amplifier array 3. Transistors 5 and 6, forming first and second switch means, respectively are provided between the first memory cell array 1 and the sense amplifier array 3, and a transistor 7, forming third switch means is provided between the sense amplifier array 3 and the second memory cell array 2.

The first memory cell array 1 and the second memory cell array 2 are each formed by a matrix of memory cells, each of which is formed by an access transistor 11 and a capacitor 12. The gates of the access transistors 11 are connected to word lines WL1, WL2, ..., WL1', WL2', .... One of the source and the drain of each access transistor 11 is connected to a bit line BL and $\overline{BL}$, while the other of the source and the drain is connected to a capacitor 12. The bit lines BL and $\overline{BL}$ are paired. In FIG. 1, the bit line pairs for the column numbers i to i+3 are shown for simplicity. These bit line pairs are selected by the turning on and off of row selection transistors 14 which are fed with column selection signals.

The sense amplifiers 13 making up the sense amplifier array 3 are provided between the first memory cell array 1 and the second memory cell array 2 so that each sense amplifier 13 is associated with one bit line pair BL and $\overline{BL}$. The sense amplifiers 13 are shared by the memory cell arrays 1 and 2 and operate to amplify the differential signal between the bit lines BL and $\overline{BL}$ extending across the memory cell arrays 1 and 2. That is, the sense amplifiers 13 are so-called shared sense amplifiers and, by means of the transistors 5, 6 and 7 of the first, second and third switching means as later described, divide the bit line pairs BL and $\overline{BL}$ extending across the memory cell arrays 1 and 2.

The I/O line pair 4, adjacent to the first memory cell array 1, is formed by an I/O line and an $\overline{I/O}$ line. The $\overline{I/O}$ line is connected via one set of column selection transistors 14 to the bit lines BL, while the I/O line is connected via another set of column selection transistors 14 to the bit lines $\overline{BL}$. Data transfer is performed via this I/O line pair 4.

The transistors 5,6 forming the first and second switch means connect or disconnect electrically the bit lines BL and $\overline{BL}$ between the first memory cell array 1 and the sense amplifiers 13. The transistors 5 are connected in series with the paired bit lines selected by column selection signals $Y_i, Y_{i+2}, \ldots$. To the gate of each of the transistors 5 is supplied a switching signal $\phi ISO_1$, such that, when the switching signal $\phi ISO_1$ is at an "H" (high) level, the bit lines BL and $\overline{BL}$ and the associated sense amplifier 13 are connected to each other and, when the switching signal $\phi ISO_1$ is at an "L" (low) level, the bit lines BL and $\overline{BL}$ and the sense amplifier 13 are disconnected from each other. The transistors 6 forming the second switch means are connected in series with paired bit lines selected by column selection signals $Y_{i+1}, Y_{i+3}, \ldots$. Thus the bit columns controlled by transistors 5 and the bit columns controlled by transistors 6 are arrayed alternately and the bit lines are divided into a bit line group selected by the transistors 5 and a bit line group selected by the transistors 6. To the gate of each transistor 6 is supplied a switching signal $\phi$ $ISO_2$, such that, when the switching signal $\phi ISO_2$ is at an "H" level, the bit lines BL and $\overline{BL}$ and the associated sense amplifier 13 are connected to each other and, when the switching signal $\phi ISO_2$ is at an "L" level, the bit lines BL and $\overline{BL}$ and the associated sense amplifier 13 are disconnected from each other.

The transistors 7 of the third switch means are provided between the sense amplifier array 3 and the memory cell array 2. Each transistor 7 is connected in series with the bit lines BL and $\overline{BL}$ connected to each sense amplifier 13 between it and the second memory cell array. To the gate of the transistor 7 is supplied a switching signal $\phi ISO_0$, such that, when the switching signal $\phi ISO_0$ is at an "H" level, transistor 7 is turned on and, when the switching signal $\phi ISO_0$ is at an "L" level, transistor 7 is turned off.

To the side of the second memory cell array 2, opposite to the sense amplifiers 13, transistors 15 and 16, forming a bit line loading circuit and an equalizer circuit are provided, and are controlled by a signal $\phi RES$.

Figure 2:
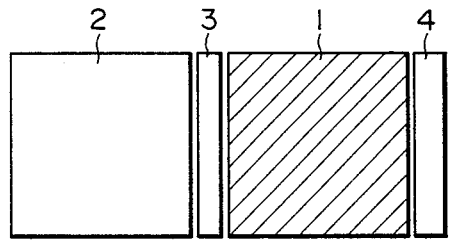
FIG. 2 is a diagrammatic view showing areas charged and discharged on accessing the first memory cell array of the DRAM shown in FIG. 1.
Figure 3:
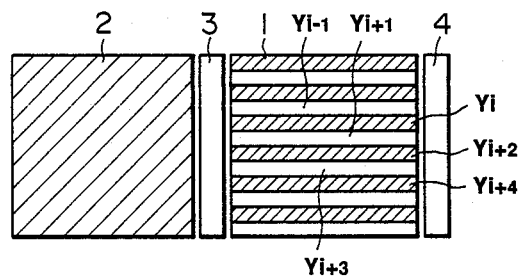
FIG. 3 is a diagrammatic view showing areas charged and discharged on accessing the second memory cell array of the DRAM shown in FIG. 1.
Figure 4:
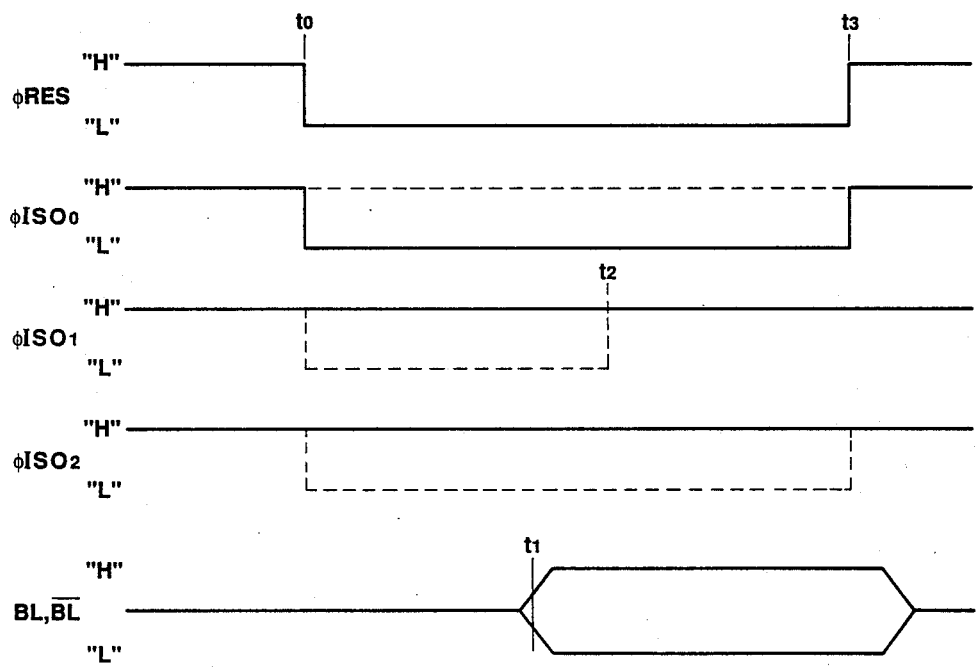
FIG. 4 is a time chart for illustrating the operation of the DRAM shown in FIG. 1.

Referring to FIGS. 2 to 4, the case of accessing the first memory cell array 1 and the case of accessing the second memory cell array 2 will be explained.

When accessing the first memory cell array 1, the signal $\phi RES$ goes at time $t_0$ to an "L" level, while the signal $\phi ISO_0$ also goes to an "L" level, as indicated by solid lines in FIG. 4. The transistors 15 and 16 are turned off, the transistors 7 of the third switch means are also turned off. The signals $\phi ISO_1$ and $\phi ISO_2$ are both at the "H" (high) level, so that the transistors 5 and 6 are turned on. Thus the sense amplifiers 13 are connected via bit lines BL and $\overline{BL}$ only with the first memory cell array 1. After such activation of the first and second switch means, one of the word lines WL1', WL2', ... is selected by row address signals. Then, at time $t_1$, from the sensing operation of the sense amplifier 13, the potentials of the bit lines BL and $\overline{BL}$ are amplified to an "H" level and an "L" level, respectively, in association with data of the selected memory cell. Since the transistor 7 is turned off and the transistors 5 and 6 are turned on, the areas of the bit lines BL and $\overline{BL}$ that are charged and discharged at this time are only those areas extending over the first memory cell array 1, as shown in FIG. 2. The areas of the bit lines BL and $\overline{BL}$ extending over the second memory cell array 2 are not charged or discharged.

One of the column selection signals $Y_i, Y_{i+3}, \ldots$ goes to an "H" level and only the bit line pair associated with the selected column is connected to the I/O line pair 4 to permit data reading and writing. Restoration is performed only with respect to the first memory cell 1 with the bit lines BL and $\overline{BL}$ of the second memory cell array 2 not being charged or discharged. At time $t_3$, the signal $\phi RES$ is changed from the "L" level to the "H" level, while the signal $\phi ISO_0$ is changed from the "L" level to the "H" level.

When accessing the second memory cell array 2, the signal $\phi RES$ goes to an "L" level at time $t_0$, as shown in FIG. 4, while the signal $\phi ISO_0$ remains at an "H" level, as shown by the dashed line in FIG. 4 so that the transistors 7 remain on. At this time $t_0$, the signals $\phi ISO_1$, and $\phi IOS_2$ controlling the transistors 5 and 6 are changed from the "H" level to the "L" level, as shown by the dashed lines in FIG. 4, so that the transistors 5 and 6 are turned off. Hence, only the second memory cell array 2 is connected via the bit lines BL and $\overline{BL}$ to the sense amplifiers 13. After such activation of the first and second switch means, one of the word lines WL1, WL2, ... is selected by the row address signals. Then, at time $t_1$, from the sensing operation of the sense amplifier 13, the potentials of the bit lines BL and $\overline{BL}$ are amplified to the "H" level and "L" level, respectively, in association with the data of the selected memory cell. Since the transistor 7 is turned on and the transistors 5 and 6 are turned off, the areas of the bit lines BL and $\overline{BL}$ that are charged or discharged are limited to areas of the second memory cell array 2.

The data of the selected memory cell are amplified by such activation of the sense amplifiers 13. However, during reading or writing, it is necessary to turn the transistors 5 or 6 on selectively depending on the position of the accessed memory cell to connect the memory cell to the I/O lines. When accessing a memory cell associated with the bit lines BL and $\overline{BL}$ selected by, for example, one of the selection signals $Y_i, Y_{i+2}, \ldots$, the signal $\phi ISO_1$ is changed at time $t_2$ from the "L" level to the "H" level, as shown by dashed line in FIG. 4. Only the one bit line pair among the bit lines BL and $\overline{BL}$ extending into the first memory cell array 1, which is selected by the column selection signals $Y_i, Y_{i+2}, \ldots$ is connected with the sense amplifier 13 via transistor 5. Since the signal $\phi ISO_2$ remains at the "L" level, transistor 6 remains off. Thus a memory cell on a column associated with the transistors 5, that is, a column selected by selection signals $Y_i, Y_{i+2}, \ldots$ is connected by the bit lines BL and $\overline{BL}$ with the I/O lines. FIG. 3 shows the bit line areas charged and discharged at this time by hatched lines. In the conventional practice, it has been necessary to charge and discharge the totality of the bit lines extending all over the first memory cell array at the time the memory cells of the second memory cell array 2 are selected, whereas, in the present embodiment, only one half the bit lines extending over the first memory cell array 1 represent the area which is to be charged or discharged. In addition, the bit lines are divided into two groups, so that, when accessing the second memory cell, it is three fourths of the overall area that is charged or discharged, whereas one fourth of the overall area is not charged or discharged, so that the power consumption can be reduced.

When accessing the memory cells associated with the other transistors 6, it suffices to change the signal $\phi ISO_2$ at time $t_2$ from the "L" level to the "H" level, with the signal $\phi ISO_1$, remaining at the "L" level.

At time $t_3$, the signal $\phi RES$ is changed from the "L" level to the "H" level, while the signal $\phi ISO_2$ or $\phi ISO_1$ is changed from the "L" level to the "H" level.

In the above described operation of the DRAM of the present embodiment, when an access is had to a memory cell of the second memory cell array 2, only one half of the bit lines extended into the first memory cell array 1 are used, so that the other half of the bit lines of the first memory cell array 1 are not charged or discharged. Hence, the power consumption accompanying the charging and discharging is reduced, while high speed operation is simultaneously achieved.

Second Embodiment

The DRAM of the second embodiment is so arranged that the number of the memory cell arrays, that is, the number of blocks, is double that of the DRAM of the preceding embodiment, with the control being made to provide for a constant power consumption.

Figure 5:
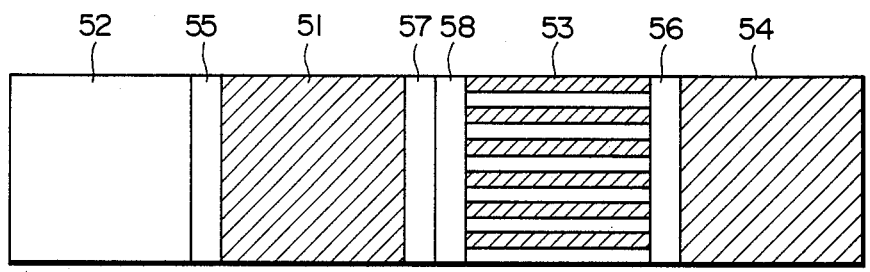
FIG. 5 is a diagrammatic view for illustrating a modified embodiment of the DRAM of the present invention.

Referring to FIG. 5, the DRAM shown therein is formed by two blocks, there being four memory cell arrays 51, 52, 53 and 54, with a sense amplifier array 55 between the memory cell arrays 51 and 52 and a sense amplifier array 56 between the memory cell arrays 51 and 52. The I/O line pair 57, 58 is provided between the memory cell arrays 51 and 53, so that the memory cell arrays 51 and 53 represent the first memory cell array having a first and a second switch means (not shown), similar to transistors 5 and 6, for dividing the bit lines into plural groups.

In the present DRAM wherein the number of the memory cell arrays is twice that in the DRAM of the preceding first embodiment, when one of the I/O lines 57 and 58 is accessing one of the first memory cell arrays, the second memory cell array in the other block is accessed simultaneously. In FIG. 5, the areas shown by the hatched lines are those areas undergoing charging and discharging. For example, the memory cell arrays 51 and 54 have their memory cells being accessed and the bit lines divided during the operation are only those associated with the memory cell array 53. As shown, it is five eighths of the overall area that undergoes charging or discharging, so that the power consumption is again reduced.

In the DRAM of the present embodiment, when the first memory cell array is accessed in one of the blocks, the second memory cell array is accessed in the other block. Thus the block controlled by the solid line and the block controlled by the dashed line in FIG. 4 are contiguous to each other. In this manner, the hatched line area in FIG. 5 remains constant at all times, with the figure of five eighths not being changed.

The number of the blocks is not limited to two and a similar control operation can be performed with respect to a larger number of blocks.

Third Embodiment

In the present third embodiment, the bit lines are divided into three bit line groups.

Figure 6:
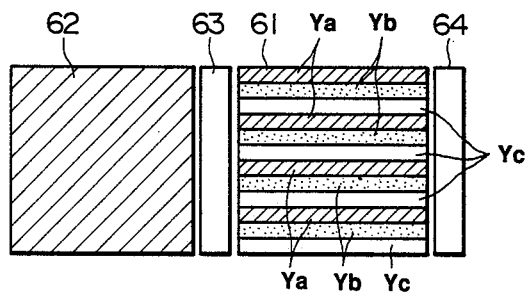
FIG. 6 is a diagrammatic view for illustrating another modified embodiment of the DRAM of the present invention.
Figure 7:
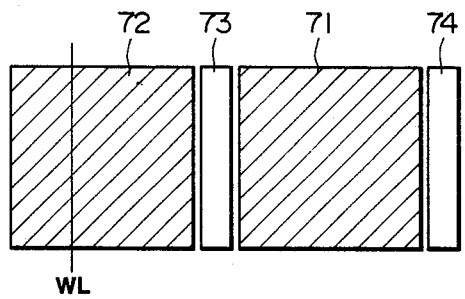
FIG. 7 is a diagrammatic view for illustrating a conventional DRAM.

Referring to FIG. 6, the bit lines in the first memory cell array 61 are divided into a group of bit columns Ya, a group of bit columns Yb and a group of bit columns Yc. A sense amplifier array 63 is provided between the first memory cell array 61 and the second memory cell array 62, and an I/O line pair 64 is provided for connecting to the sense amplifier array 63, with the first memory cell array 61 inbetween. Although not shown, first, second and third switches (cf. transistors 5, 6 and 7) are provided, with three signals being controlled by the first and second switch means.

In the above described construction of the DRAM, only one of the three bit line groups Ya, Yb and Yc undergoes charging or discharging during accessing of the second memory cell array 62. It is the bit line group associated with the bit lines BL and $\overline{BL}$ associated in turn with the accessed memory cells that is selected.

In the above construction, the power consumption can be reduced, while simultaneously speeding up of the operation.

The number of divisions of the bit lines can be four or more instead of three in the above described third embodiment.

It is to be noted that the present invention is not limited to the above embodiments, but may be modified without departing from the purport of the invention.

We claim:

1. A DRAM having folded bit line-shared sense amplifiers comprising
   a first array of memory cells;
   a second array of memory cells;
   an array of sense amplifiers provided between and shared by said memory cell arrays;
   a plurality of bit line pairs, each pair having connected therebetween a different memory cell of the first array, a different sense amplifier, and a different memory cell of the second array and wherein the bit line pairs are divided into at least a first group and a second group;
   separate input/output means connected to each bit line pair at one end to selectively transfer data to each bit line pair;
   separate first switch means provided in series with each bit line pair of the first group between the memory cell of first array and the sense amplifier;
   separate second switch means provided in series with each bit line pair of the second group between the memory cell of first array and the sense amplifier; and
   separate third switch means provided in series with each bit line pair between and separating the memory cell of the second array and the sense amplifier from each other; and
   wherein the first switch means, the second switch means and the third switch means are responsive to separate control signals.

2. The DRAM having folded bit line-shared sense amplifiers according to claim 1, wherein the bit line pairs are grouped alternately in the first group or the second group.

3. The DRAM having folded bit line-shared sense amplifiers according to claim 2, further comprising means for supplying separate control signals to all of the first switching means in common and all of the second switching means in common during accessing of a selected the memory cell of the second array so that plural sense amplifiers and the input/output means are connected via the first group of bit line pairs while the second group of the bit line pairs are disconnected from the input/output means.

4. The DRAM having folded bit line-shared sense amplifiers according to claim 3, further comprising means for supplying the same control signal simultaneously to all of the third switching means.

* * * * *